(12) United States Patent
Tanizaki et al.

(10) Patent No.: US 8,508,986 B2
(45) Date of Patent: Aug. 13, 2013

(54) SEMICONDUCTOR DEVICE

(75) Inventors: Hiroaki Tanizaki, Itami (JP);
Yasumitsu Murai, Itami (JP); Takaharu Tsuji, Kanagawa (JP); Masanori Hayashikoshi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 124 days.

(21) Appl. No.: 13/188,924

(22) Filed: Jul. 22, 2011

(65) Prior Publication Data

US 2012/0075921 A1 Mar. 29, 2012

(30) Foreign Application Priority Data

Sep. 29, 2010 (JP) ................................. 2010-218587

(51) Int. Cl.
*G11C 11/00* (2006.01)

(52) U.S. Cl.
USPC .................. 365/158; 365/230.06; 365/189.16

(58) Field of Classification Search
USPC ............... 365/158, 171, 173, 189.16, 230.06, 365/148
See application file for complete search history.

(56) References Cited

U.S. PATENT DOCUMENTS 6,490,217 B1   12/2002   DeBrosse et al.
7,167,389 B2 *  1/2007   Iwata .............................. 365/158

FOREIGN PATENT DOCUMENTS

JP     2003-045173     2/2003

* cited by examiner

*Primary Examiner* — David Lam
(74) *Attorney, Agent, or Firm* — McDermott Will & Emery LLP

(57) ABSTRACT

A semiconductor device having first and second digit line drivers and a bit line driver. When the address of one segment has been input from the outside, a segment decoder selects one segment corresponding to the address and couples the same to the selected first digit line driver. When the addresses of two or more segments have been input from the outside, the segment decoder selects two or more segments corresponding to the addresses and couples the selected two or more segments to the respective digital line drivers.

10 Claims, 18 Drawing Sheets

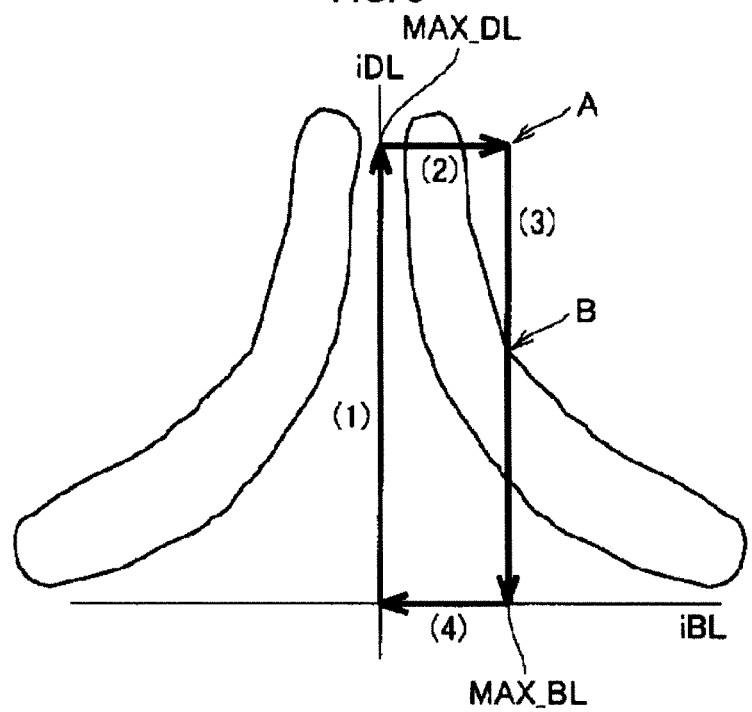
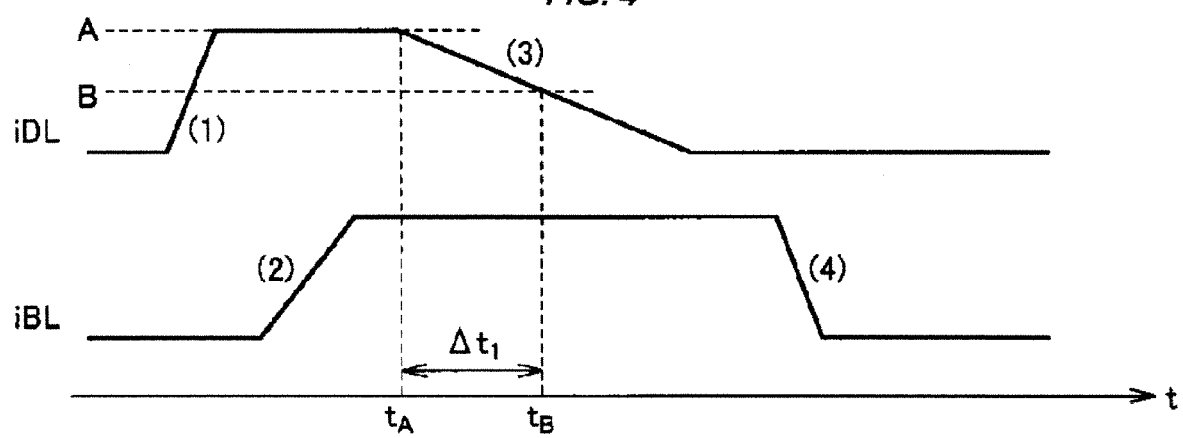

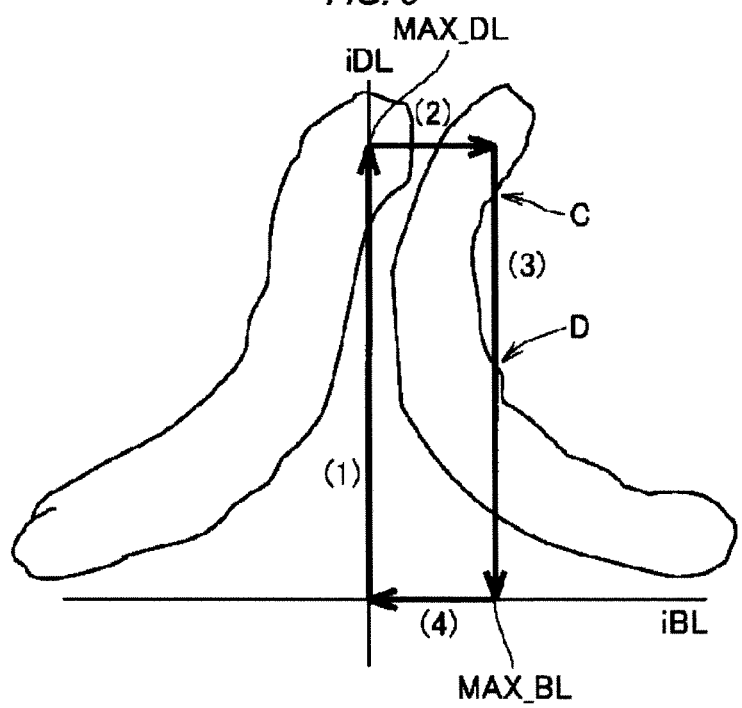
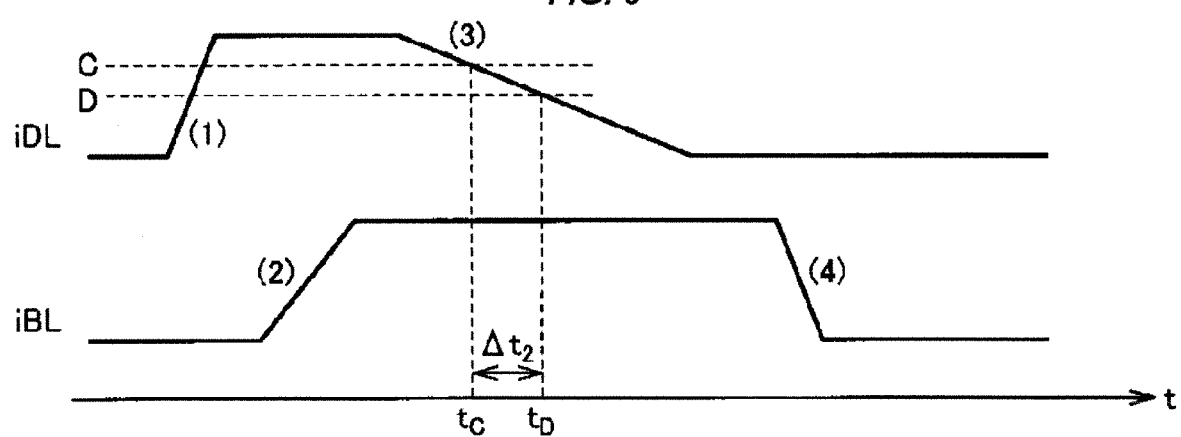

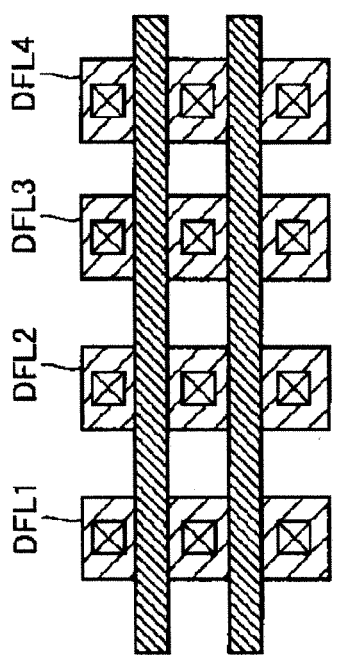
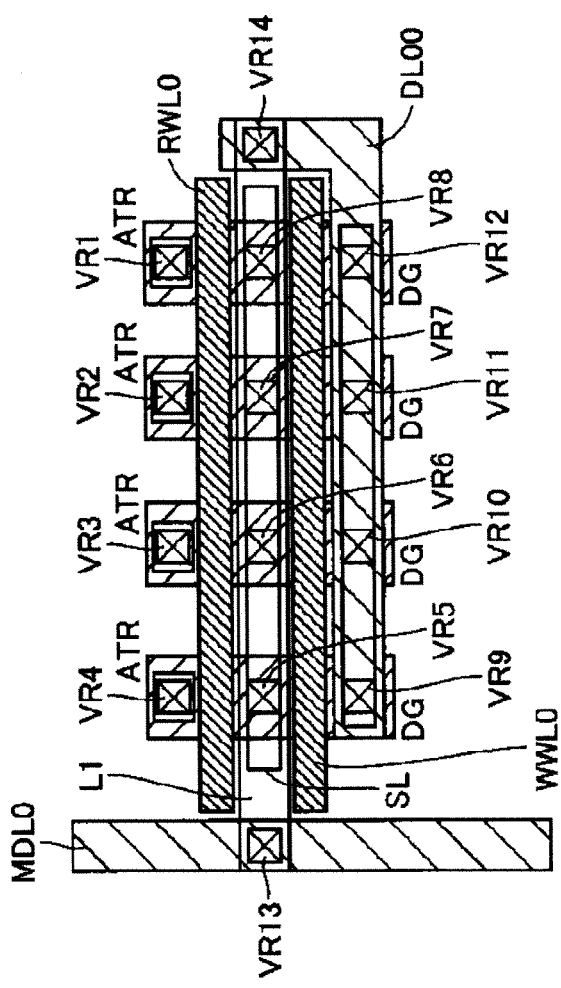

SEMICONDUCTOR DEVICE

CROSS-REFERENCE TO RELATED APPLICATION

The disclosure of Japanese Patent Application No. 2010-218587 filed on Sep. 29, 2010 including the specification, drawings and abstract is incorporated herein by reference in its entirety.

BACKGROUND

The present invention relates to semiconductor devices, and in particular relates to a semiconductor device formed over a semiconductor substrate and including a memory cell for magnetically storing a data signal.

A nonvolatile semiconductor memory device is capable of holding stored data even if a power supply voltage is turned off, whereby there is no need to supply the power supply voltage in a standby state. For this reason, the nonvolatile semiconductor memory device is widely used in portable devices that are required to have low power consumption.

One of such nonvolatile semiconductor memory devices is an MRAM (Magnetic Random Access Memory) that stores data by using a magnetoresistance effect. Moreover, one of MRAMs uses a tunnel magnetoresistive element having a magnetic tunnel junction (MTJ: Magnetic Tunnel Junction).

The tunnel magnetoresistive element includes a tunnel insulating film and two ferromagnetic material layers stacked over and under the tunnel insulating film. The resistance value of the tunnel magnetoresistive element becomes the minimum when the directions of the magnetic moment of two ferromagnetic material layers are the same, and becomes the maximum when the directions are opposite to each other. The case where the resistance value of the tunnel magnetoresistive element is minimum and maximum is associated with a data signal "0" and "1", respectively, and thus the data signals "0" and "1" can be stored. The directions of the magnetic moment of two ferromagnetic material layers of the tunnel magnetoresistive element are permanently maintained until a magnetic field in a direction opposite to a level exceeding a threshold level is applied.

The MRAM includes a plurality of tunnel magnetoresistive elements arranged in a plurality of rows and a plurality of columns, a digit line provided corresponding to each row, and a bit line provided corresponding to each column, wherein a data signal is written to a selected tunnel magnetoresistive element by causing a magnetizing current to flow through the digit line of a selected row and also causing a write current to flow in a direction corresponding to a write-data signal to the bit line of a selected column.

FIG. 22 is a diagram showing an arrangement relation among a memory cell (tunnel magnetoresistance measure), a bit line BL, and a digit line DL.

A memory cell at an intersection between a selected digit line DL and a selected bit line BL serves as a selected cell. A magnetic field concentrates on the selected cell and data is written thereto because a current flows through the selected digit line DL and the selected bit line BL.

FIG. 23 is a diagram representing switching characteristics of a TRM element. FIG. 23 shows a relation among the directions of a magnetizing current iDL and a write current iBL and the direction of the magnetic field when data is written.

A magnetic field Hx represented by the horizontal axis indicates a magnetic field H(DL) generated by the magnetizing current iDL flowing through the digit line DL. On the other hand, a magnetic field Hy represented by the vertical axis indicates a magnetic field H(BL) generated by the write current iBL flowing through the bit line BL.

With regard to the direction of the magnetic field stored in the tunnel magnetoresistive element TMR, only when a sum of the magnetic field H(DL) and H(BL) reaches the area outside an asteroid characteristic line shown in the view, new writing is carried out. That is, when a magnetic field corresponding to the area inside the asteroid characteristic line is applied, the direction of the magnetic field stored in the tunnel magnetoresistive element TMR is not updated. Accordingly, in order to update the stored data in the tunnel magnetoresistive element TMR by a write operation, a current needs to be caused to flow through both the digit line DL and the bit line BL. Here, assume that the magnetizing current iDL in one direction is caused to flow through the digit line DL, while the write current iBL in a direction corresponding to the logic (0 or 1) of a data signal is caused to flow through the bit line BL. The direction of the magnetic field which has been stored once in the tunnel magnetoresistive element TMR (i.e., the stored data) is held in a nonvolatile manner until new data writing is carried out.

Meanwhile, in the MRAM, not only a selected tunnel magnetoresistive element but also other tunnel magnetoresistive elements of the selected row and column may be disturbed by the magnetic field, resulting in the false inversion of a data signal.

As shown in FIG. 23, a disturbance in the DL1 axis occurs in a non-selected memory cell DD on the selected digit line DL. Moreover, a disturbance in the BL1 axis occurs in a non-selected memory cell DB on the selected bit line BL.

The possibility of false inversion (the probability of false inversion) of a data signal increases in proportion to the magnitude of the disturbance magnetic field which a tunnel magnetoresistive element is receiving. As the probability of the false inversion of a data signal increases, the failure rate when used as the memory device increases and the reliability decreases.

In order to solve such a problem, a segment writing method is used in the MRAM described in Japanese Patent Application Laid-Open No. 2003-45173 (Patent Document 1). In the segment writing method, since data is written simultaneously to a plurality of memory cells belonging to a segment, there is no memory cell (non-selected cell), to which the data is not written, on the digit line DL and thus the DL1 axis disturbance can be eliminated.

FIG. 24 is a diagram representing switching characteristics of the TRM element when the segment writing is carried out.

As shown in FIG. 24, the writing area is expanded by the segment writing. Furthermore, since there is no disturbance in the magnetizing current iDL, a lot of magnetizing current iDL can be caused to flow and the write current iBL can be reduced. This can reduce the current consumption as a whole.

SUMMARY

As shown in FIG. 24, when there is no distortion in the shape of the TMR or in a fixing layer of the TMR, the switching characteristics become symmetrical with respect to the magnetizing current iDL.

However, when the segment writing method is used, there is a problem that data cannot be normally written when there is a distortion in the switching characteristics of the TRM element.

FIG. 25 is a diagram representing switching characteristics of the TRM element with distortion when the segment writing is carried out.

Referring to FIG. 25, when there is a distortion in the shape of the TMR or in a fixing layer of the TMR, the switching characteristics cannot be symmetrical with respect to the magnetizing current iDL. Although FIG. 25 illustrates a case where a writable area shifts to the right-hand side, the writable area may shift to the left-hand side. In such a case, when a lot of magnetizing current iDL is caused to flow, the TMR has to operate in an area where the TMR cannot switch and thus the write operation cannot be normally performed.

Moreover, in the segment writing method, when the number of I/O's is variable, the following problem occurs. For example, in cases where the number of columns in a segment is 32, if a 32-bit write unit is changed to a 16-bit unit, then there is a problem that a non-selected cell occurs in the segment, the DL1 axis disturbance occurs, and the write operation cannot be normally performed.

The present invention has been made in view of the above circumstances and provides a semiconductor device using a segment writing method capable of realizing a normal write operation.

A semiconductor device of one embodiment of the present invention includes a memory array in which a memory cell for magnetically storing a data signal is arranged in a matrix. The memory array is divided into a plurality of segments for each predetermined number of columns, and furthermore each segment is divided into blocks for each row. This semiconductor device includes the following: a digit line provided for each block; a plurality of bit lines provided corresponding to each column; a plurality of digit line drivers each causing a magnetizing current to flow through the digit line of a selected block; a bit line driver which causes a write current to flow in a direction corresponding to a logic of a data signal to a bit line in a selected segment and writes the data signal to a memory cell of the selected block; and a decoder which, when an address of one segment has been input from the outside, selects one segment corresponding to the address and couples the selected segment to either one of the digit line drivers, and which, when addresses of two or more segments have been input from the outside, selects two or more segments corresponding to the addresses and couples the selected two or more segments to different digit line drivers.

According to one embodiment of the present invention, a segment writing method can be carried out normally.

BRIEF DESCRIPTION OF THE DRAWINGS

FIG. 3 is a diagram representing switching characteristics when data is written to a memory cell without distortion;

FIG. 4 is a diagram representing the changes in time of a magnetizing current iDL and a write current iBL when data is written to the memory cell without distortion;

FIG. 5 is a diagram representing switching characteristics when data is written to a memory cell with distortion;

FIG. 6 is a diagram representing the changes in time of the magnetizing current iDL and the write current iBL when data is written to the memory cell with distortion;

FIG. 21A is a view of the structure of the block BK00 of FIG. 2 viewed from a direction perpendicular to the semiconductor substrate;

FIG. 21B is a view for explaining a diffusion region of a transistor in FIG. 21A;

DETAILED DESCRIPTION

Hereinafter, embodiments of the present invention will be described with reference to the accompanying drawings.

First Embodiment

Configuration of Semiconductor Chip

Figure 1:
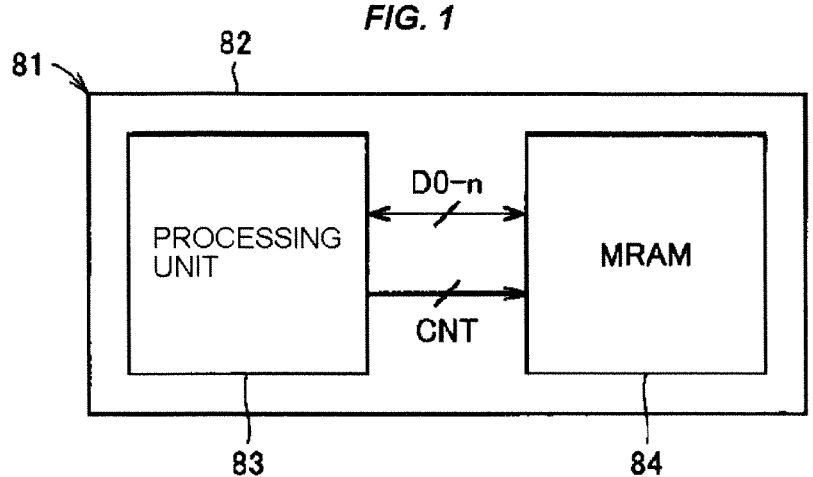
FIG. 1 is a block diagram illustrating a configuration of a semiconductor chip of a first embodiment.

FIG. 1 is a block diagram illustrating a configuration of a semiconductor chip of a first embodiment.

In FIG. 1, a semiconductor chip 81 includes a semiconductor substrate 82, and a processing unit 83 and an MRAM 84 formed in the surface thereof.

The processing unit 83 includes a CPU (Central Processing Unit) performing a predetermined calculation processing, a memory controller controlling the MRAM 84, and the like.

The MRAM 84 is used for storing and reading a program code or data. A control signal CNT containing an address signal and the like is provided to the MRAM 84 from the processing unit 83, and multi-bit data signals D0 to Dn−1 are transmitted and received between the processing unit 83 and the MRAM 84. Here, n is a natural number, e.g., 16, 32, 64, or 128.

The more the number of bits of the data signals D0 to Dn−1 transferred and received in parallel between the processing unit 83 and the MRAM 84, the higher the operation speed of the semiconductor chip 81 becomes. Accordingly, in such a semiconductor chip 1 that has a memory unit and the processing unit formed on the same chip, an increase in the number of bits of the data signals D0 to Dn−1 is indispensable.

(Configuration of MRAM)

Figure 2:
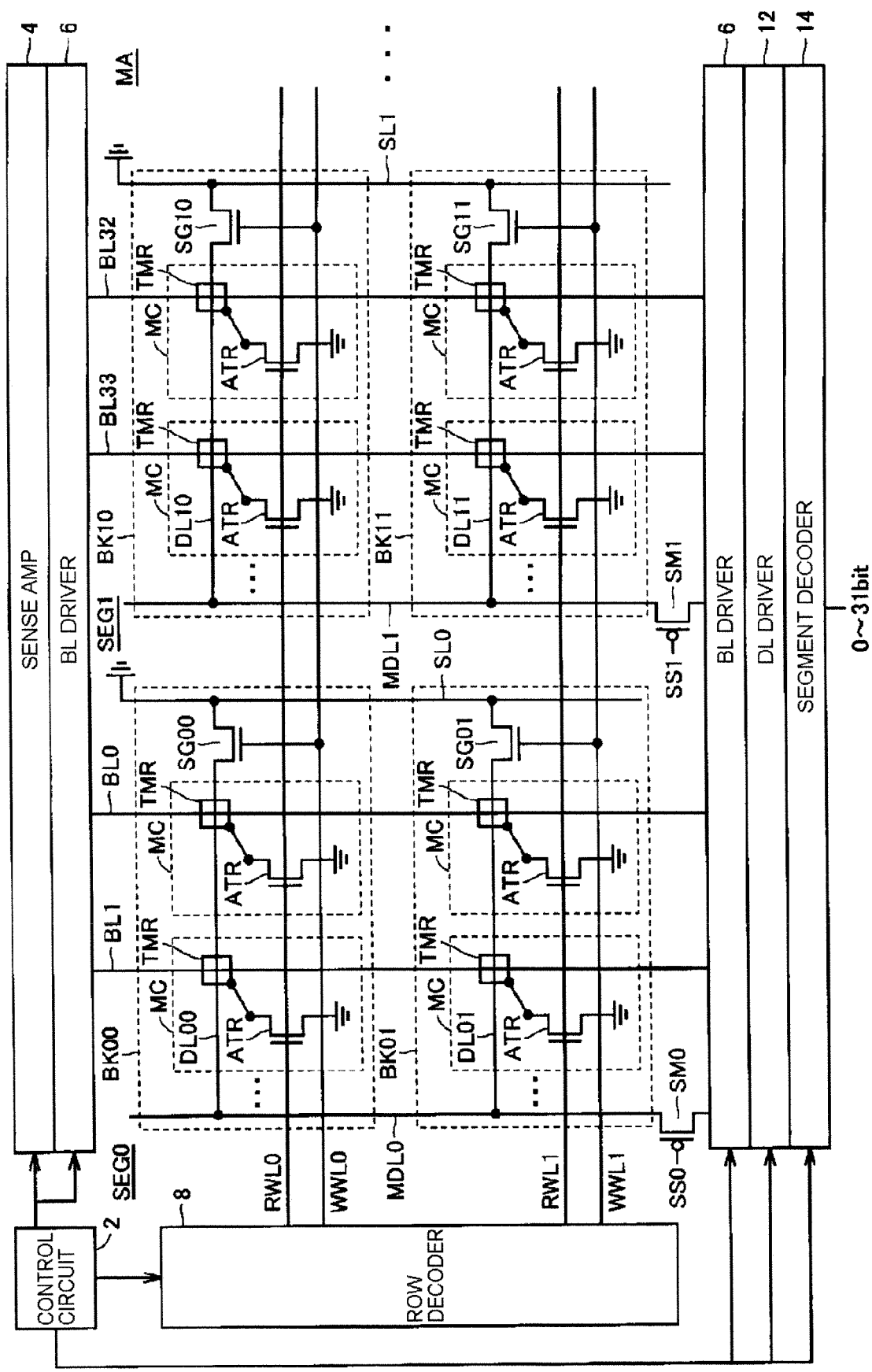
FIG. 2 is a block diagram illustrating a configuration of an MRAM of the first embodiment.

FIG. 2 is a block diagram showing a configuration of the MRAM of the first embodiment.

In FIG. 2, the MRAM 84 includes a memory array MA, a control circuit 2, a row decoder 8, a sense amplifier 4, a BL driver 6, a DL driver 12, and a segment decoder 14.

In the memory array MA, a memory cell MC is arranged in a matrix. In each row, a read word line RWL and a write word line WWL are arranged.

The memory array MA includes M segments SEG0, SEG1, . . . , and SEGM−1. Each segment SEGk (k=0 to M−1) includes N columns of memory cells MC. N bit-lines BL, one main digit line MDLk, and one source line SLk are arranged in each segment SEGk. Here, the description is made assuming M=32.

Each segment SEGk includes K blocks BKk0, BKk1, . . . , and BKkk−1 each composed of one row, and a segment selection gate SMk.

The segment selection gate SMk is composed of a P-channel MOS transistor. A selection signal SS is provided to the gate of the segment selection gate SMk. When the selection signal SS is activated to an "L" level, the segment selection gate SMk is turned on to couple the DL driver 12 to the main digit line MDLk in the segment SEGk, and thus the magnetizing current iDL from the DL driver 12 is supplied to the main digit line MDLk.

Each block BKks (k=0 to M−1, s=0 to K−1) includes N memory cells MC and a DL selection gate SGks. A digit line DLks is arranged corresponding to each block BKks.

The DL selection gate SGks is composed of an N-channel MOS transistor. A write word line WWLs is coupled to the gate of the DL selection gate SGks. When the write word line WWLs is activated to an "H" level, the DL selection gate SGks is turned on to couple the digit line DLks to the source line SLk, and thus the magnetizing current iDL can be caused to flow through the digit line DLks.

The block BK to be written is selected by the segment selection gate SM and the DL selection gate SG.

Each memory cell MC includes the tunnel magnetoresistive element TMR and an access transistor (N-channel MOS transistor) ATR.

The tunnel magnetoresistive element TMR and the access transistor ATR are coupled in series between the corresponding bit line BL and a ground voltage VSS line, and the gate of the access transistor ATR is coupled to the corresponding read word line RWL.

The tunnel magnetoresistive element TMR is arranged between the digit line DL and the bit line BL. The magnetization easy axis of the tunnel magnetoresistive element TMR is directed in the extending direction of the digit line DL while its magnetization difficult axis is directed in the extending direction of the bit line BL. When the magnetizing current iDL is caused to flow through the digit line DL and also the write current iBL in a direction corresponding to the logic of the write-data signal is caused to flow through the bit line BL, the magnetization direction of the tunnel magnetoresistive element TMR is directed to the positive direction or negative direction of the magnetization easy axis according to the direction of the write current iBL. The tunnel magnetoresistive element TMR goes into a high resistance state or a low resistance state according to its magnetization direction.

When data is written, the read word line RWL is set to the "L" level of a non-selection level and the access transistor ATR is put into a non-conductive state. Moreover, the write word line WWL is set to the "H" level of a selection level to turn on the DL selection gate SG, and thus the magnetizing current iDL is caused to flow through the digit line DL in the block. In addition, the write current iBL is also caused to flow through the bit line BL. The magnetization direction of the tunnel magnetoresistive element TMR is determined by the combination of both directions of the magnetizing current iDL and write current iBL.

When data is read, the read word line RWL is set to the "H" level of the selection level to conduct the access transistor ATR, and thus a current Is flows from the bit line BL to the ground via the tunnel magnetoresistive element TMR and the access transistor ATR. The value of the current Is varies with the resistance value of the tunnel magnetoresistive element TMR. By the sense amplifier 4 detecting the value of the current Is, the stored data of the tunnel magnetoresistive element TMR can be read.

The control circuit 2 controls the whole MRAM 84. In reading data, the sense amplifier 4 amplifies the data which has been output to the bit line BL, and outputs the amplified data to the outside.

The segment decoder 14 selects one segment according to the address of a segment provided from the outside. In writing data, the segment decoder 14 activates the selection signal SSk, which is to be provided to the gate of the segment selection gate SMk of the selected segment SEGk, to an "L" level to turn on the segment selection gate SMk, thereby coupling the main digit line MDLk to the DL driver 12.

The DL driver 12 supplies the magnetizing current iDL to the main digit line MDL of the selected segment SEGk via the segment selection gate SMk. The magnetizing current iDL is supplied to the digit line DLks of the selected block BKks via the DL selection gate SGks so as to put the memory cell MC in the selected block BKks into a half-selected state.

The BL driver 6 is coupled to the N bit-lines BL in the selected segment SEGk, and upon receipt of the write-data signals WD0 to WDn−1, outputs the write currents iBL0 to iBLn−1 corresponding to the values of the write-data signals WD0 to WDn−1. The write-data signals WD0 to WDn−1 are the data signals D0 to Dn−1 provided from the processing unit 3. Here, n is assumed to be 32 which is the number of columns in one segment. A write current in the direction corresponding to the logic of a data signal is caused to flow through the N bit-lines BL of the selected segment SEGk so as to write the data signal to the memory cell MC of the block BLks, which has been put into a half-selected state.

(Writing to a Memory Cell without Distortion)

FIG. 3 is a diagram representing switching characteristics when data is written to a memory cell without distortion.

FIG. 4 is a diagram representing changes in time of the magnetizing current iDL and the write current iBL when data is written to the memory cell without distortion.

Referring to FIGS. 3 and 4, first, as indicated by an arrow (1), the magnetizing current iDL is increased from "0" to the maximum value MAX_DL by the DL driver 12. Next, as indicated by an arrow (2), the write current iBL is increased to MAX_BL by the BL driver 6. Subsequently, as indicated by an arrow (3), the magnetizing current iDL is reduced from the maximum value MAX_DL to "0" by the DL driver 12. Finally, as indicated by an arrow (4), the write current iBL is reduced from MAX_BL to "0" by the BL driver 6.

Here, since data is written to the memory cell when the magnetizing current iDL and the write current iBL are located outside the asteroid curve, the data can be written to the memory cell when the magnitude of the magnetizing current iDL is in a range from A (=MAX_DL) to B. The longer the time period during which the magnetizing current iDL and the write current iBL are located outside the asteroid curve, the more reliably the writing is performed and therefore the longer time period Δt1 during which the magnitude of the magnetizing current iDL is located in the range from A to B is more preferable.

(Writing to a Memory Cell with Distortion)

FIG. 5 is a diagram representing switching characteristics when data is written to a memory cell with distortion.

FIG. 6 is a diagram representing the changes in time of the magnetizing current iDL and the write current iBL when data is written to the memory cell with distortion.

Referring to FIG. 5 and FIG. 6, since data is written to the memory cell when the magnetizing current iDL and the write current iBL are located outside the asteroid curve, the data can be written to the memory cell when the magnitude of the magnetizing current iDL is in a range from C to D. The longer the time period during which the magnetizing current iDL and the write current iBL are located outside the asteroid curve, the more reliably the writing is performed and therefore the longer time period Δt2 during which the magnitude of the magnetizing current iDL is located in the range from C to D is more preferable. Δt2 is smaller than Δt1.

In the embodiment of the present invention, also in order to reliably write data to the memory cell with distortion, the magnetizing current iDL is caused to slowly fall so that Δt2 becomes equal to or greater than a value sufficient for normally performing the writing. Specifically, the DL driver 12, when the magnetizing current iDL falls, reduces the magnetizing current iDL at a speed slower than that when the magnetizing current iDL rises.

(Specific Example of the Configuration of the DL Driver 12)

Figure 7:
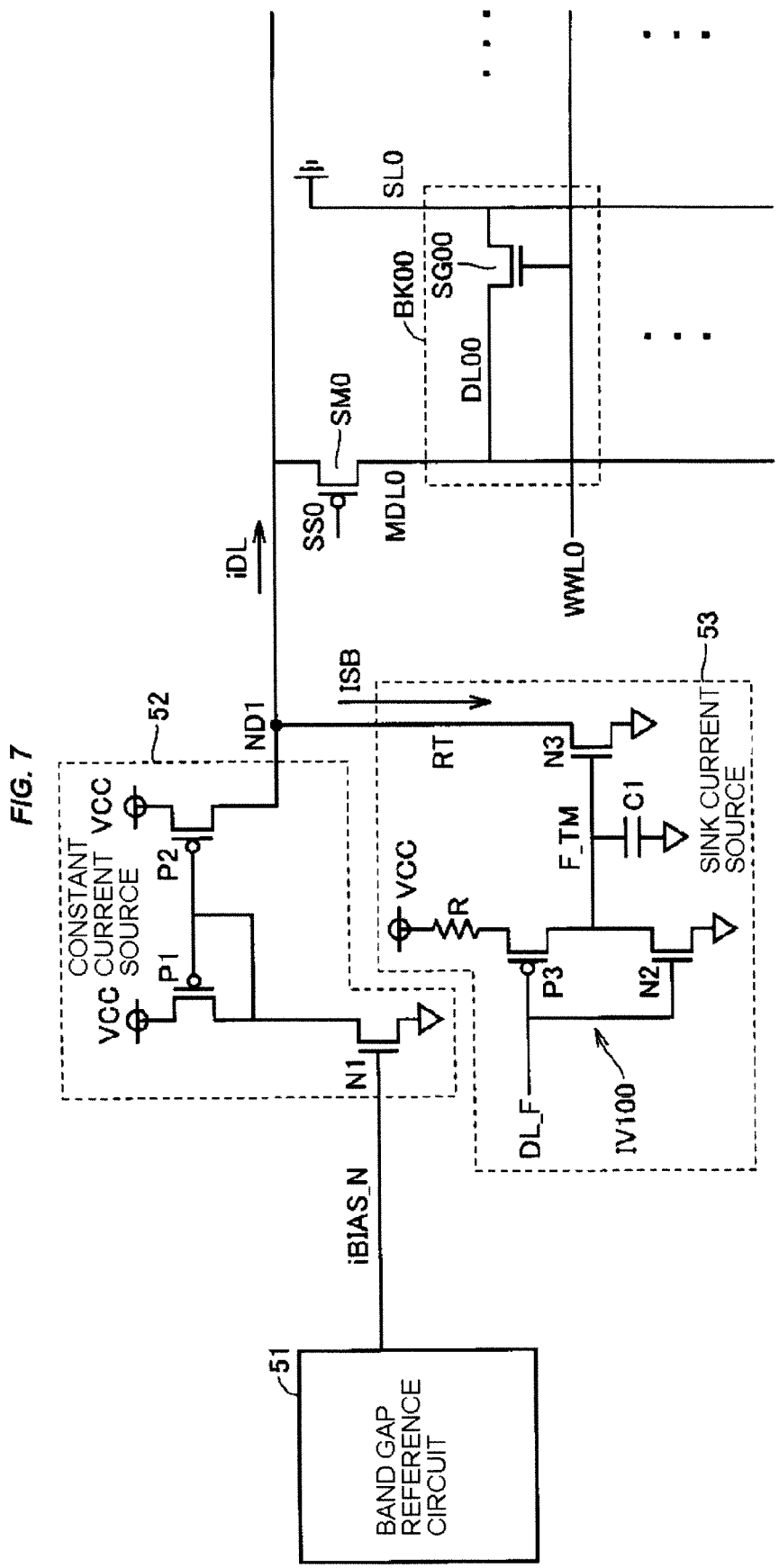
FIG. 7 is a diagram representing an example of the configuration of a DL driver of the first embodiment.

FIG. 7 is a diagram representing an example of the configuration of the DL driver 12 of the first embodiment.

Referring to FIG. 7, the DL driver 12 includes a band gap reference circuit 51, a constant current source 52, and a sink current source 53.

The band gap reference circuit 51 generates a reference voltage iBIAS_N. The constant current source 52 supplies a specific amount of current. The constant current source 52 includes an N-channel MOS transistor N1 and P-channel MOS transistors P1 and P2.

The P-channel MOS transistor P1 and the N-channel MOS transistor N1 are provided in series between a VCC power supply and a ground GND.

The P-channel MOS transistor P2 is provided between the VCC power supply and a node ND1. The gate of the P-channel MOS transistor P1 and the gate of the P-channel MOS transistor P2 are coupled to each other and are also coupled to the drain of the N-channel MOS transistor N1.

The gate of the N-channel MOS transistor N1 receives the reference voltage iBIAS_N output from the band gap reference circuit 51.

The sink current source 53 includes an inverter IV100 composed of a P-channel MOS transistor P3 and an N-channel MOS transistor N2, and a resistive element R provided between the VCC power supply and the P-channel MOS transistor P3. Furthermore, the sink current source 53 includes an N-channel MOS transistor N3 and a capacitive element C1. The resistive element R and the capacitive element C1 constitute an RC circuit. The capacitive element C1 is provided between the output of the inverter IV100 and the ground GND. The N-channel MOS transistor N3 is present in parallel to a path, through which the magnetizing current iDL flows from the output node ND1 of the constant current source 52, and is provided in a sink current path RT between the output node ND1 and the ground GND, wherein the gate of the N-channel MOS transistor N3 is coupled to the output of the inverter IV100.

(Operation Timing)

Figure 8:
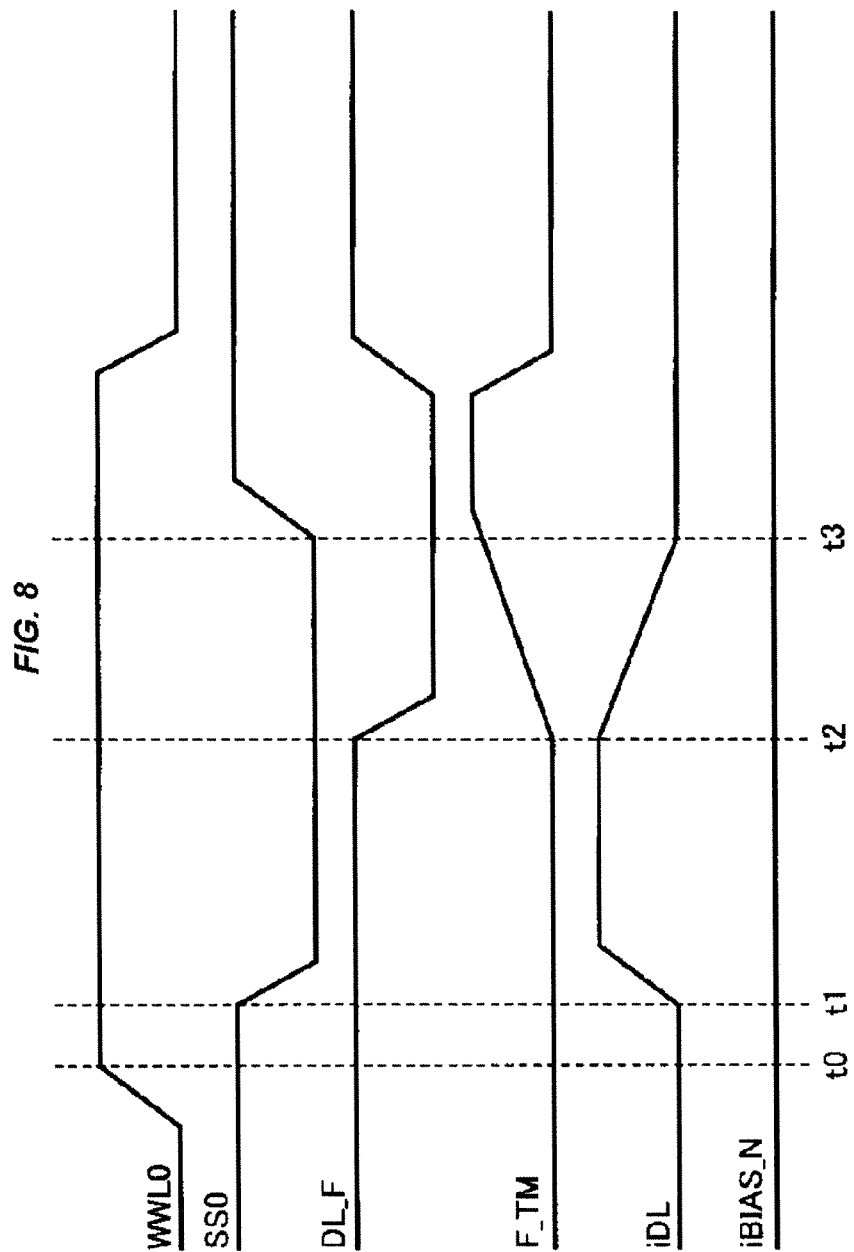
FIG. 8 is a diagram representing the timings at which the signals and currents of the first embodiment change.

FIG. 8 is a diagram representing the timings at which the signals and currents of the first embodiment change.

Here, a case where data is written to the block BK00 of the 0th segment will be described.

Referring to FIG. 8, the band gap reference circuit 51 generates the reference voltage iBIAS_N of an "H" level.

At a time point of t0, the row decoder 8 activates a write word line WWL0, which is specified by a row address (the 0th row address) input from the outside, to an "H" level. This turns on the DL selection gate SG00 present in the 0th row.

Next, at a time point of t1, the segment decoder 14 sets the selection signal SS0 to an "L" level. This turns on the segment selection gate SM0 present in the 0th segment.

When the segment selection gate SM0 is turned on and the DL selection gate SG00 is turned on, the magnetizing current iDL flowing through the digit line DL00 present in the block BK00 of the 0th segment increases from "0".

Next, at a time point of t2, the control circuit 2 sets the control signal DL_F to an "L" level. When the control signal DL_F reaches the "L" level, the potential of a node F_TM is increased by the inverter IV100 after the time point of t2. Since the inverter IV100 is coupled to the resistive element R and the capacitive element C1, the increase in the potential of the node F_TM is slow due to an RC delay. Since the sink current ISB flowing through the N-channel MOS transistor N3 slowly increases due to the slow increase in the potential of the node F_TM, the magnitude of the magnetizing current iDL slowly decreases.

Next, at a time point of t3, the control circuit 2 sets the selection signal SS0 to an "H" level. This turns off the segment selection gate SM0 present in the 0th segment, and thus the current supply to the digit line DL00 present in the block BK00 of the 0th segment stops.

(Summary)

As described above, in the embodiment, by causing the magnetizing current iDL to rise with a slope, the optimum writing suitable for the switching characteristics of the tunnel magnetoresistive element TMR can be achieved.

Second Embodiment

The MRAM of a second embodiment includes the DL driver different from the MRAM of the first embodiment.

Figure 9:
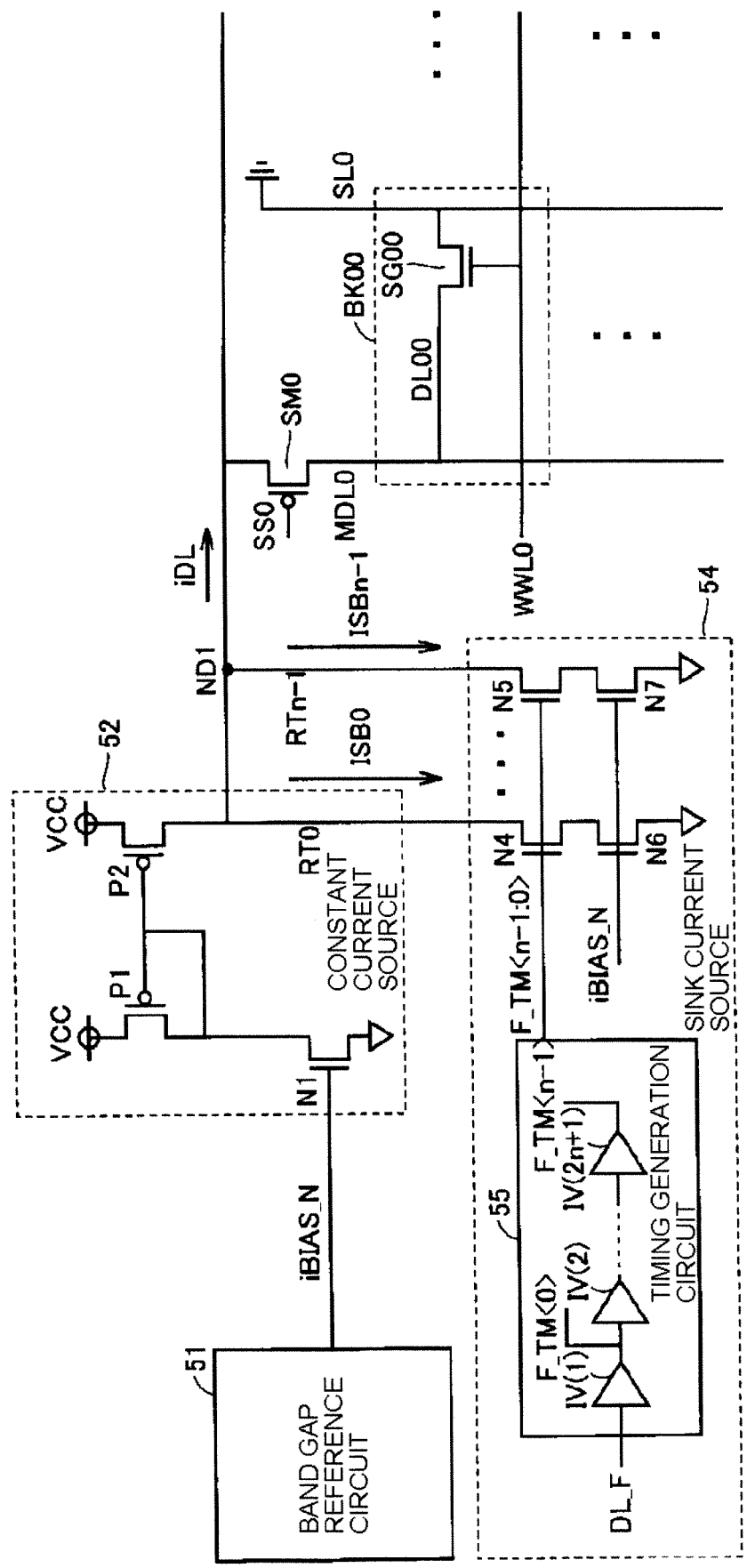
FIG. 9 is a diagram representing a configuration of the DL driver of a second embodiment.

FIG. 9 is a diagram representing a configuration of the DL driver of the second embodiment. The DL driver of FIG. 9 differs from the DL driver 12 of the first embodiment of FIG. 2 in terms of a sink current source 54.

The sink current source 54 of FIG. 9 includes a timing generation circuit 55 and a plurality of N-channel MOS transistors.

The timing generation circuit 55 outputs n timing signals F_TM<0> to F_TM<n−1> which are activated at different timings. The timing generation circuit 55 includes a plurality of inverters coupled in series. The control signal DL_F described in the first embodiment is input to the inverter IV of the first stage.

The timing signal F_TM<0> is output from the inverter IV(1) in the first stage. The timing signal F_TM<1> is output from the inverter IV(3) in the third stage. The timing signal F_TM<n−1> is output from the inverter IV(2n+1) in the (2n+1)th stage.

Each of n sink current paths of the 0th path RT(0) to (n−1)th path RT(n−1) is present in parallel to the path through which the magnetizing current iDL flows from the output node ND1 of the constant current source 52. Two N-channel MOS transistors are coupled in series to each of the RT(0) to RT(n−1), and control the magnitudes of the sink currents ISB0 to ISB (n−1).

For example, in the 0th path RT0, an N-channel MOS transistor N4 and an N-channel MOS transistor N6 are provided between the node ND1 and the ground GND.

The timing signal F_TM<0> generated by the timing generation circuit 55 is input to the gate of the N-channel MOS transistor N4. The reference voltage iBIAS_N generated by the band gap reference circuit 51 is input to the gate of the N-channel MOS transistor N6.

Moreover, in the (n−1)th path RT(n−1), an N-channel MOS transistor N5 and an N-channel MOS transistor N7 are provided between the node ND1 and the ground GND. The timing signal F_TM<n−1> generated by the timing generation circuit 55 is input to the gate of the N-channel MOS transistor N5. The reference voltage iBIAS_N generated by the band gap reference circuit 51 is input to the gate of the N-channel MOS transistor N7.

(Operation Timing)

Figure 10:
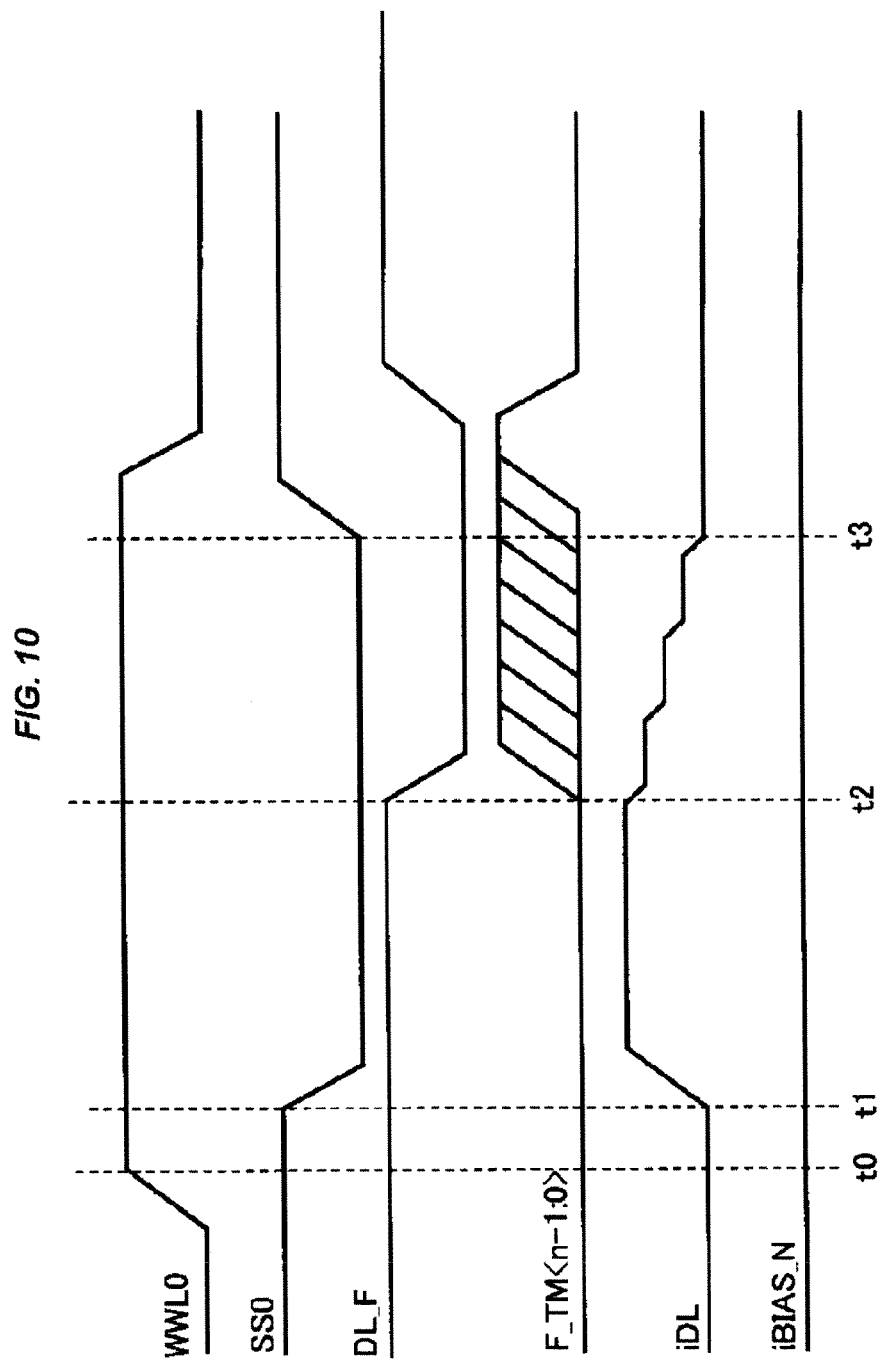
FIG. 10 is a diagram representing the timings at which the signals and currents of a third embodiment change.

FIG. 10 is a diagram representing the timings at which the signals and currents of a third embodiment change.

Here, a case where data is written to the block BK00 of the 0th segment will be described.

Referring to FIG. 10, the band gap reference circuit 51 generates the reference voltage iBIAS_N of an "H" level.

At a time point of t0, the row decoder 8 activates the write word line WWL0, which is specified by a row address (the 0th row address) input from the outside, to an "H" level. This turns on the DL selection gate SG00 present in the 0th row.

Next, at a time point of t1, the segment decoder 14 sets the selection signal SS0 to an "L" level. This turns on the segment selection gate SM0 present in the 0th segment.

When the segment selection gate SM0 is turned on and the DL selection gate SG00 is turned on, the magnetizing current iDL flowing through the digit line DL00 present in the block BK00 of the 0th segment increases from "0".

Next, at a time point of t2, the control circuit 2 sets the control signal DL_F to an "L" level. When the control signal DL_F reaches the "L" level, then after the time point of t2, the control signals F_TM<k> (k=0 to n−1) successively rise to an "H" level, one by one, at a predetermined time interval (a delay time generated by two inverters). When the control signal F_TM<k> rises to the "H" level, the current ISB(k) flows through the k-th path RT(k). Accordingly, after the time point of t2, the magnitude of the magnetizing current iDL slowly decreases stepwise.

Next, at a time point of t3, the control circuit 2 sets the selection signal SS0 to an "H" level. This turns off the segment selection gate SM0 present in the 0th segment, and thus the current supply to the digit line DL00 present in the block BK00 of the 0th segment stops.

It should be noted that the amount of the magnetizing current iDL reduced in one step can also be tuned by adjusting the value of the reference voltage iBIAS_N.

(Summary)

As described above, according to the embodiment, as with the first embodiment, by causing the magnetizing current iDL to fall with a stepwise slope, the optimum writing suitable for the switching characteristics of the tunnel magnetoresistive element TMR can be achieved.

Third Embodiment

In the first and second embodiments, as the magnetizing current iDL is caused to rise when the same data as the stored data is written, the inversion operation occurs, and subsequently as the write current iBL is caused to rise, the inversion operation occurs again, resulting in the same state as the write data. Repetition of such inversion puts the magnetization direction into an unstable state (intermediate state), and thus data cannot be written unless a large energy is applied.

Thus, in the third embodiment, the timing at which the write current iBL rises is made earlier than the timing at which the magnetizing current iDL rises.

Figure 11:
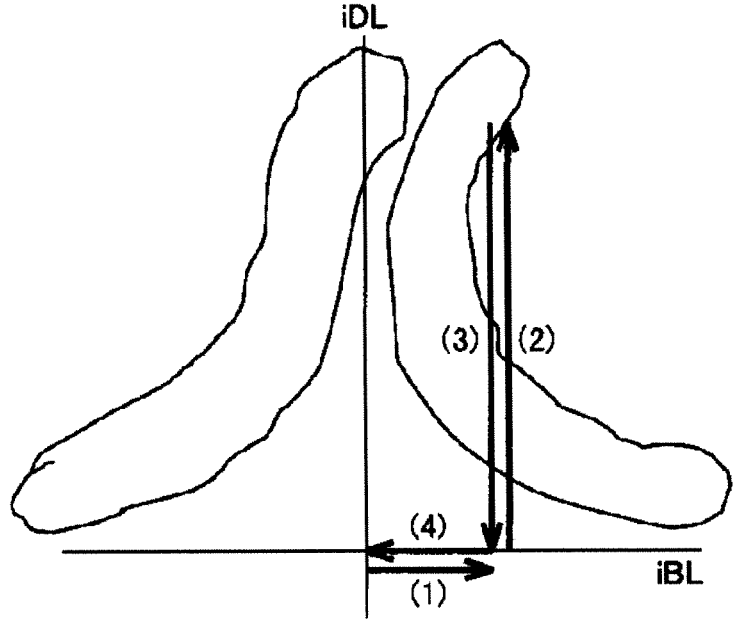
FIG. 11 is a diagram representing switching characteristics when data is written to a memory cell with distortion.

FIG. 11 is a diagram representing switching characteristics when data is written to a memory cell with distortion.

Figure 12:
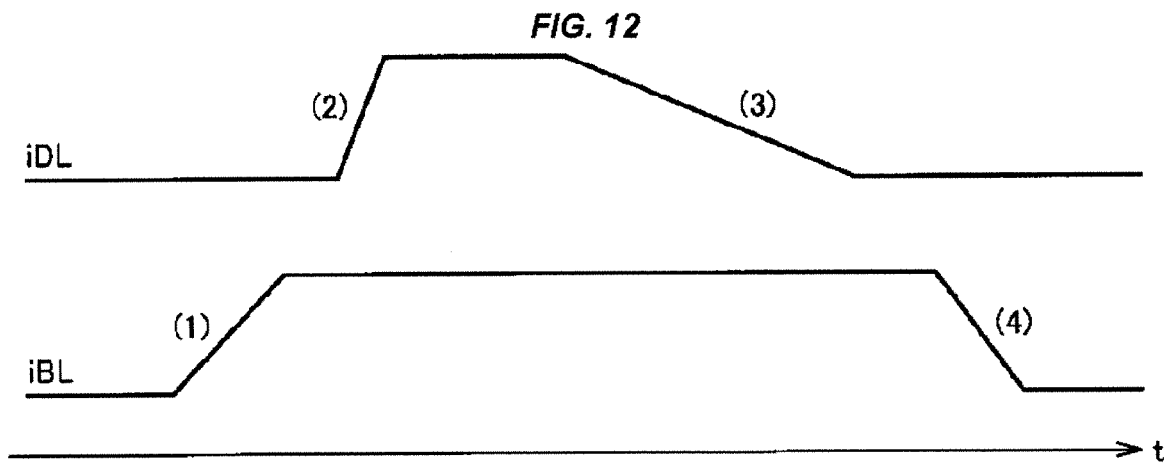
FIG. 12 is a diagram representing the changes in time of the magnetizing current iDL and the write current iBL when data is written to the memory cell with distortion.

FIG. 12 is a diagram representing the changes in time of the magnetizing current iDL and the write current iBL when data is written to the memory cell with distortion.

Referring to FIGS. 11 and 12, first, as indicated by an arrow (1), the write current iBL is increased to MAX_BL by the BL driver 6. Next, as indicated by an arrow (2), the magnetizing current iDL is increased from "0" to the maximum value MAX_DL by the DL driver 12. Subsequently, as indicated by an arrow (3), the magnetizing current iDL is reduced from the maximum value MAX_DL to "0" by the DL driver 12. Finally, as indicated by an arrow (4), the write current iBL is reduced from MAX_BL to "0" by the BL driver 6. By changing the write current iBL and the magnetizing current iDL in this manner, the paths along which the magnetizing current iDL and the write current iBL rises become the same as the paths along which the magnetizing current iDL falls and the write current iBL falls, respectively.

(Summary)

As described above, according to the embodiment, when the same data as the stored data is written, it is possible to prevent the inversion operation of the stored data from being repeated.

Fourth Embodiment

A fourth embodiment differs from the first to the third embodiments in the structure of the bit line. In the fourth embodiment, in order to concentrate the magnetic flux on a memory cell, a bit line with a clad wiring structure is used.

Figure 13:
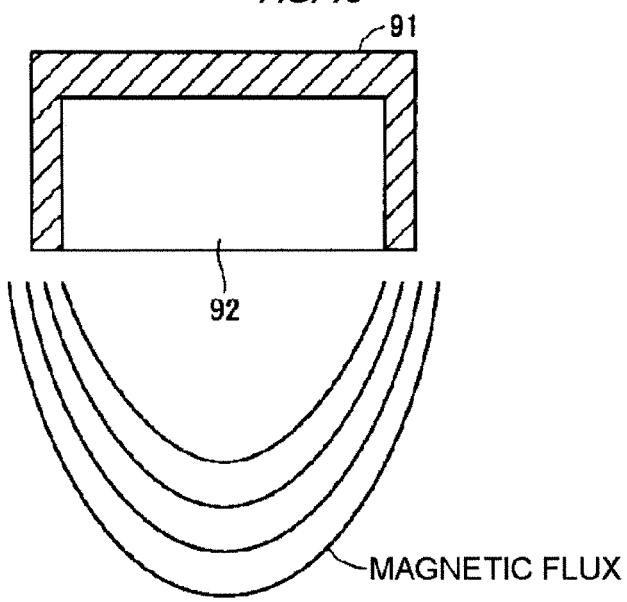
FIG. 13 is a diagram representing a structure of a bit line of a fourth embodiment.

FIG. 13 is a diagram representing the structure of the bit line of the fourth embodiment. As shown in FIG. 13, the bit line BL extends in the direction perpendicular to the plane of the figure. Among the peripheries of a conductor 92, three surfaces except the one in the direction in which the tunnel magnetoresistive element TMR is present are covered with a soft magnetism thin film 91. When the bit line BL with such a clad wiring structure is used, there arises a problem that an inductive component increases and thus a reverse current occurs both when the write current iBL rises and when the write current iBL falls.

Figure 14:
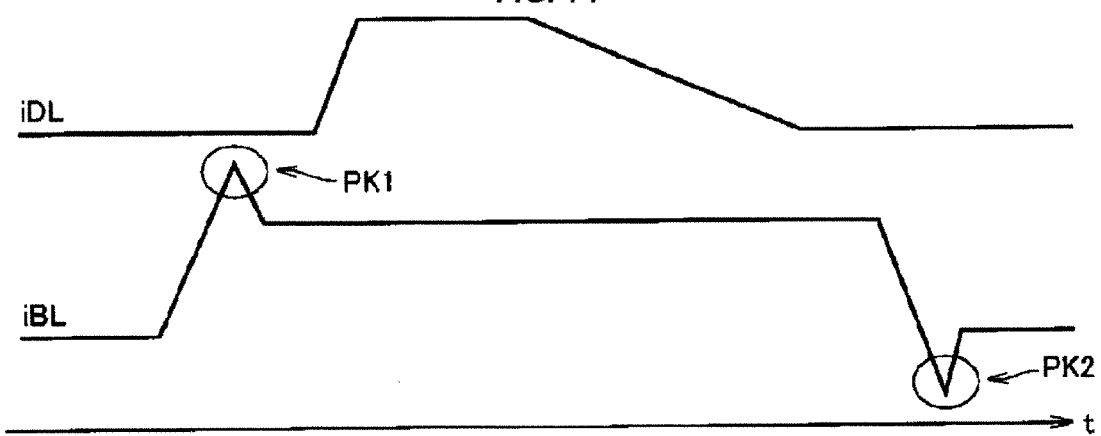
FIG. 14 is a diagram for explaining an example of the changes in time of the magnetizing current iDL and write current iBL in the related art.

FIG. 14 is a diagram for explaining an example of the changes in time of the magnetizing current iDL and the write current iBL in the related art.

In this example, as indicated by PK1 and PK2, a reverse current occurs both when the write current iBL rises and when the write current iBL falls.

Figure 15:
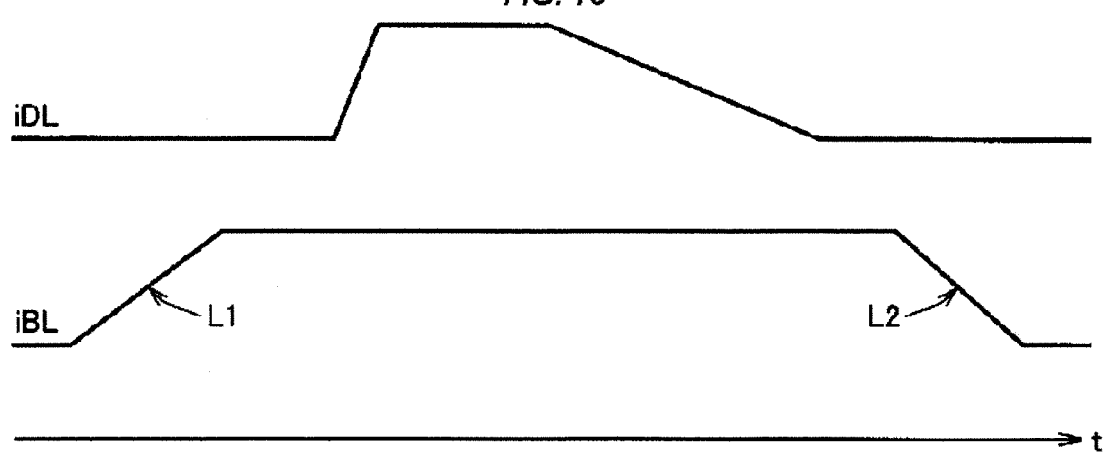
FIG. 15 is a diagram for explaining an example of the changes in time of the magnetizing current iDL and the write current iBL of the fourth embodiment.

FIG. 15 is a diagram for explaining an example of the changes in time of the magnetizing current iDL and the write current iBL of the fourth embodiment.

In this example, as indicated by L1, the write current iBL is caused to slowly rise, and as indicated by L2, the write current iBL is caused to slowly fall. This can alleviate or prevent the occurrence of the reverse current component caused by the inductive component.

Specifically, in the embodiment of the present invention, the BL driver 6 causes the write current iBL to rise or fall at a speed slower than that when the magnetizing current iDL is caused to rise by the DL driver 12.

(Summary)

As described above, according to the embodiment, although the semiconductor device includes the bit line with a clad wiring structure, the occurrence of the reverse current component caused by the inductive component can be alleviated or prevented by causing the write current iBL to slowly rise and slowly fall.

Fifth Embodiment

In a fifth embodiment of the present invention, a user can select either the writing to one segment or the writing to two segments.

Figure 16:
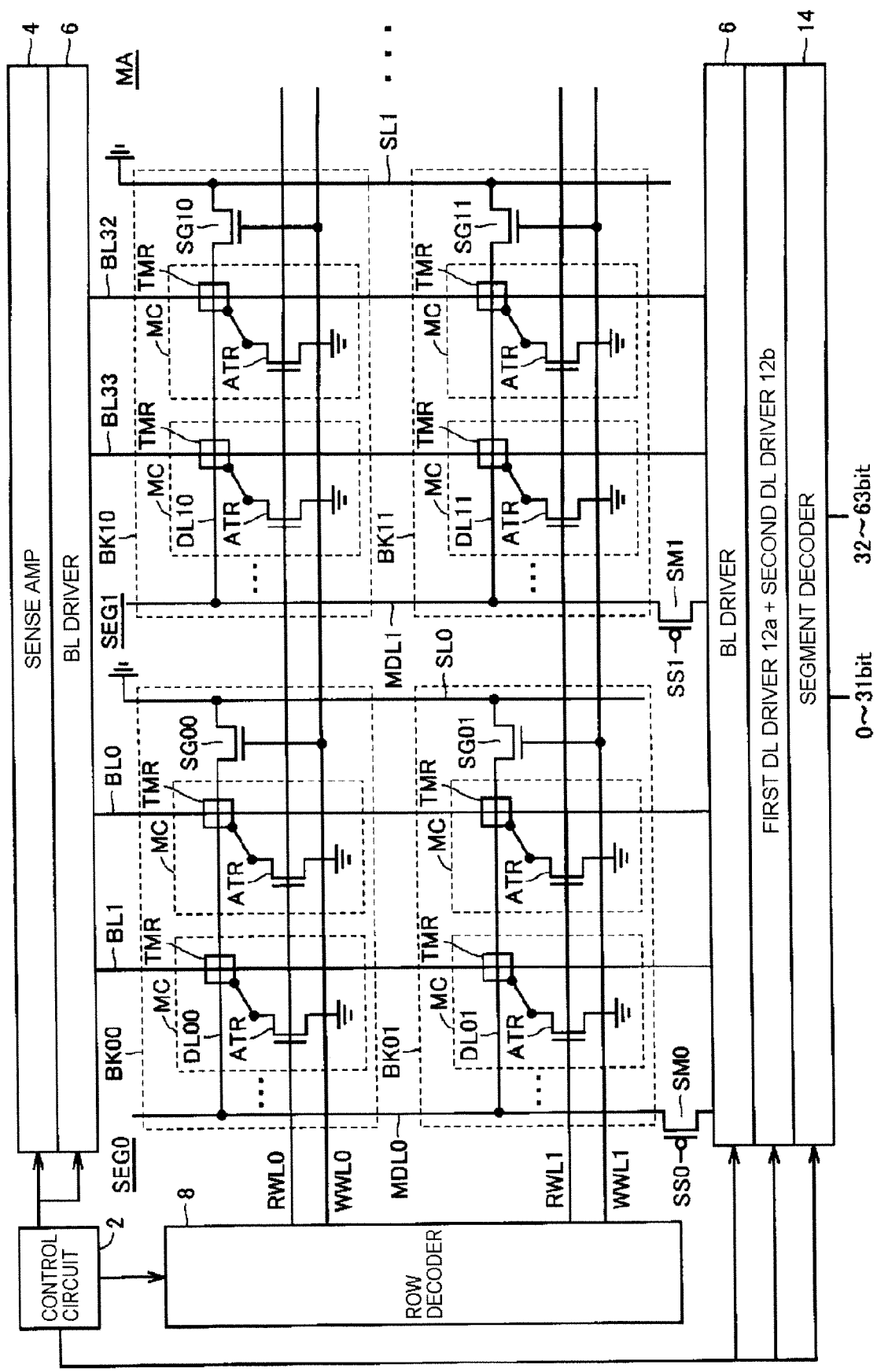
FIG. 16 is a block diagram illustrating a configuration of the MRAM of a fifth embodiment.

FIG. 16 is a block diagram showing a configuration of the MRAM of the fifth embodiment. In the fifth embodiment, the MRAM includes a first DL driver 12a and a second DL driver 12b.

The first DL driver 12a and the second DL driver 12b are the same as the DL driver described in the first embodiment or the second embodiment.

When a user specifies 32-bit writing, the address of one segment is provided to the segment decoder 14. The segment decoder 14 selects one segment according to the address of one segment provided from the outside. In writing data, the segment decoder 14 activates the selection signal SSk to be provided to the gate of the segment selection gate SMk of the selected segment SEGk, to an "L" level to turn on the segment selection gate SMk, thereby coupling the main digit line MDLk to the first DL driver 12a. The first DL driver 12a supplies a magnetizing current iDL1 to the digit line DLks of a selected block via the main digit line MDLk.

When a user specifies 64-bit writing, the addresses of two segments are provided to the segment decoder 14. The segment decoder 14 selects two segments according to the addresses of two segments provided from the outside. In writing data, the segment decoder 14 activates the selection signals SSk and SSj to be provided to the gates of the segment selection gates SMk and SMj of the selected segments SEGk and SEGj, to an "L" level to turn on the segment selection gates SMk and SMj, thereby coupling the main digit line MDLk to the first DL driver 12a and also coupling the main digit line MDLj to the second DL driver 12b. The first DL driver 12a supplies the magnetizing current iDL1 to the digit line DLks of the selected block via the main digit line MDLk. The second DL driver 12b supplies the magnetizing current iDL2 to the digit line DLjs of the selected block via the main digit line MDLj.

(Summary)

As described above, according to the embodiment, when the number of columns in a segment is minimized and the number of write-bits increases, the number of I/O can be made variable, without receiving one-axis disturbance, by increasing the number of segments to select.

Modification of the Fifth Embodiment

In this modification, in order to further avoid the disturbance, when a user specifies 64-bit writing, the addresses of two mutually-separated segments are provided to the segment decoder 14. For example, when M segments of the 0th to the (M−1)th segments are sequentially arranged in this order, the k-th and (k+M/2)th segments may be provided.

The segment decoder 14 selects two mutually-separated segments according to the addresses of the two mutually-separated segments provided from the outside. In writing data, the segment decoder 14 activates the selection signals SSk and SSj, which are to be provided to the gates of the segment selection gates SMk and SMj of the selected segments SEGk and SEGj, to an "L" level to turn on the segment selection gates SMk and SMj, thereby coupling the main digit line MDLk to the first DL driver 12a and also coupling the main digit line MDLj to the second DL driver 12b. The first DL driver 12a supplies the magnetizing current iDL1 to the digit line DLks of the selected block via the main digit line MDLk. The second DL driver 12b supplies the magnetizing current iDL2 to the digit line DLjs of the selected block via the main digit line MDLj.

(Summary)

According to the modification, by distributing the segments to be selected, the occurrence of a voltage drop and the like caused by the concentration of the write current can be prevented or alleviated and a more reliable writing operation can be achieved.

Sixth Embodiment

Figure 17B:
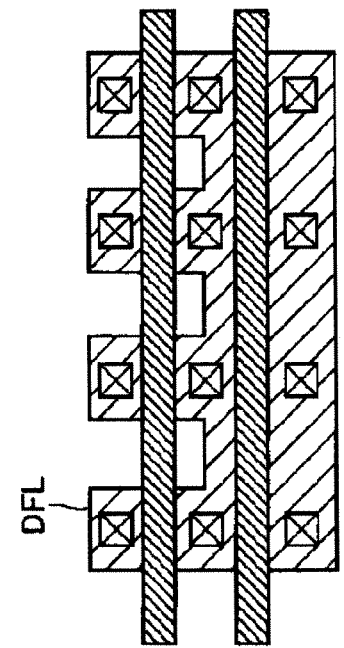
FIG. 17B is a view for explaining a diffusion region of a transistor in FIG. 17A.
Figure 17A:
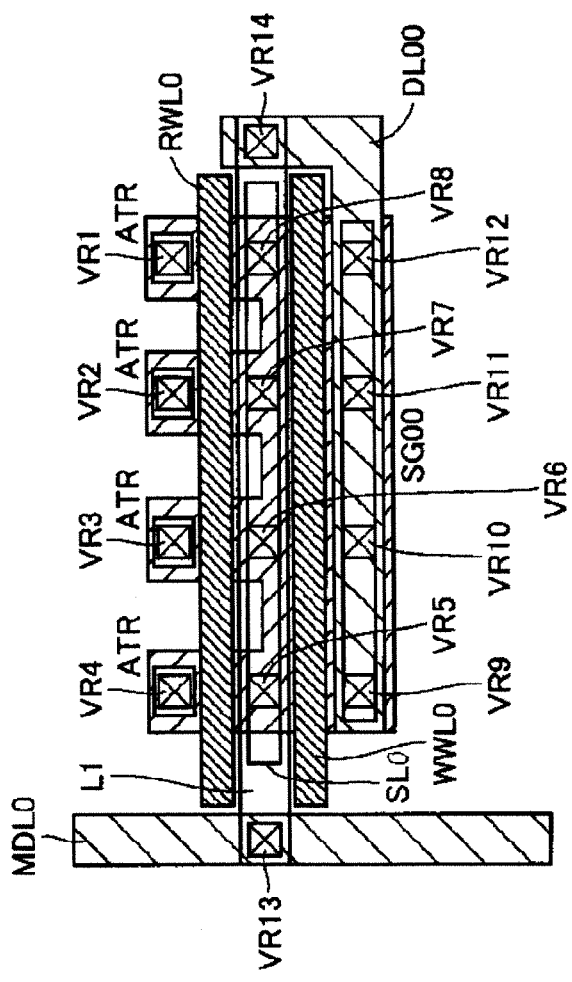
FIG. 17A is a view of the structure of a block BK00 of FIG. 2 viewed from a direction perpendicular to a semiconductor substrate.

FIG. 17A is a view of the structure of the block BK00 of FIG. 2 viewed from the direction perpendicular to the semiconductor substrate. FIG. 17B is a view for explaining the diffusion region of a transistor in FIG. 17A.

Figure 18:
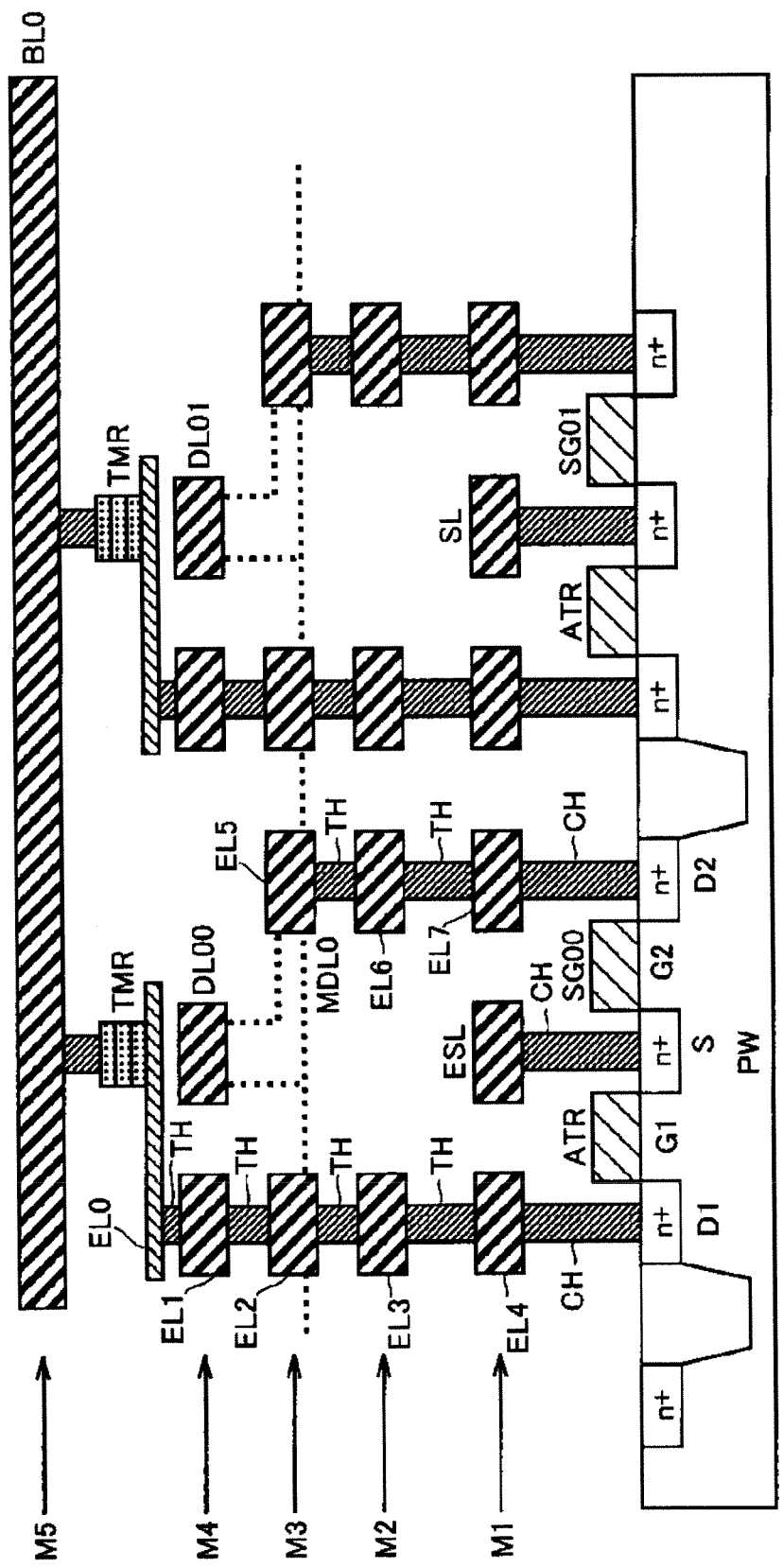
FIG. 18 is a cross-sectional view, in a direction perpendicular to a semiconductor substrate, of the configuration of a memory cell MC coupled to a bit line BL0 of FIG. 2 and DL selection gates SG00 and SG01.

FIG. 18 is a cross-sectional view, in the direction perpendicular to the semiconductor substrate, of the configuration of the memory cell MC coupled to the bit line BL0 and the DL selection gates SG00 and SG01 of FIG. 2.

Figure 19:
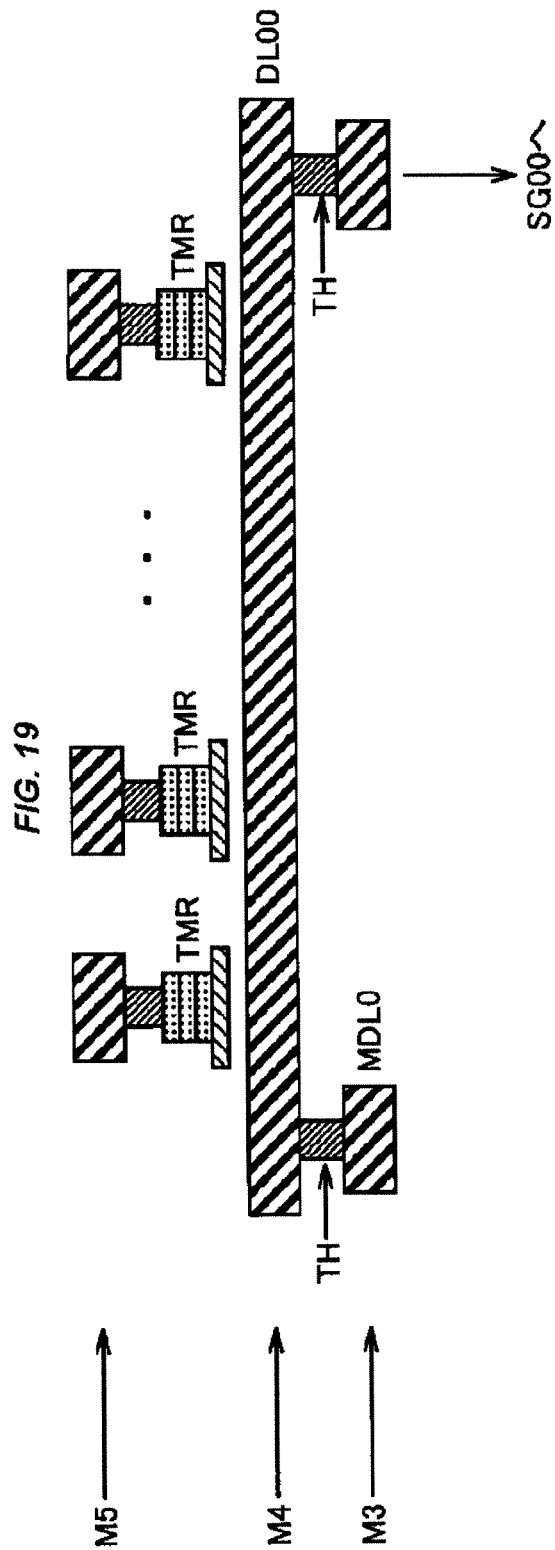
FIG. 19 is a cross-sectional view, in a direction perpendicular to the semiconductor substrate, of the third metal layer M3 and layers over the third metal layer M3 of the structure of the block BK00 of FIG. 2.

FIG. 19 is a cross-sectional view, in the direction perpendicular to the semiconductor substrate, of the third metal layer M3 and layers over the third metal layer M3 of the structure of the block BK00 of FIG. 2.

As shown in FIG. 18, gate electrodes G1 and G2 are formed at a predetermined pitch in the surface of a P-type well PW of the semiconductor substrate.

The gate electrode G1 is the gate electrode of the access transistor ATR. The read word line RWL0 is coupled to the gate electrode G1. N-type impurities are diffused on both sides of the gate electrode G1 to form a source S and a drain D1 of the access transistor ATR.

The gate electrode G2 is the gate electrode of the DL selection gate SG00 or SG01. N-type impurities are diffused on both sides of the gate electrode G2 to form a source S and a drain D2 of the DL selection gate SG00 or SG01. The source S of the access transistor ATR and the source S of the DL selection gate SG00 or SG01 are shared with each other. By sharing such a source, the layout area can be reduced.

As shown in FIG. 17A, the write word line WWL0 is coupled to the gate of the DL selection gate SG00. Moreover, as shown in FIG. 17A, the gate of the access transistor ATR is coupled to the read word line RWL0.

As shown in FIGS. 17A and 18, the main digit line MDL0 formed of the third metal layer M3 is coupled to the digit line DL00 and digit line DL01 formed of the second metal layer M2 via the through-hole TH and a metal wiring L1. The digit lines DL00 and DL01 are coupled to a connection electrode EL5 formed of the third metal layer M3. The connection electrode EL5 is coupled to a connection electrode EL 6 formed of the second metal layer M2 via the through-hole TH. The connection electrode EL5 is coupled to a connection electrode EL7 formed of the first metal layer M1 via the through-hole TH. The connection electrode EL7 is coupled to the drain D2 of the DL selection gates SG00 and SG01 via a contact hole CH.

Over the access transistor ATR and the source S of the DL selection gate SG00 or SG00, a source electrode ESL formed of the first metal layer M1 is arranged via the contact hole CH. As shown in FIG. 17A, the source line SL0 or source line SL1 is coupled to the source electrode ESL. The source electrode ESL is coupled to the ground.

Over the drain D1 of the access transistor ATR, a drain electrode EL4 formed of the first metal layer M1 is arranged via the contact hole CH. Over the drain electrode EL4, a connection electrode EL3 formed of the second metal layer M2 is formed via the through-hole TH. Furthermore, over the connection electrode EL3, a connection electrode EL2 formed of the third metal layer M3 is formed via the through-hole TH. Furthermore, over the connection electrode EL2, a connection electrode EL1 formed of the fourth metal layer M4 is formed via the through-hole TH. Furthermore, over the connection electrode EL1, a connection electrode EL0 is formed via the through-hole TH. The electrode EL0 extends to above the digit line DL00 or DL01. The tunnel magnetoresistive element TMR is formed on an upper region of the digit line DL00 in the upper surface of the electrode EL0. The bit line BL is formed of the fifth metal layer M5 in the surface of the tunnel magnetoresistive element TMR.

As shown in FIG. 17B, the DL selection gate SG00 and a diffusion region DFL constituting the access transistor ATR are formed in the form of a comb. Such a diffusion region DFL in the form of a comb increases the width W of the DL selection gate SG00 and allows a lot of magnetizing current iDL to flow.

Seventh Embodiment

Figure 20:
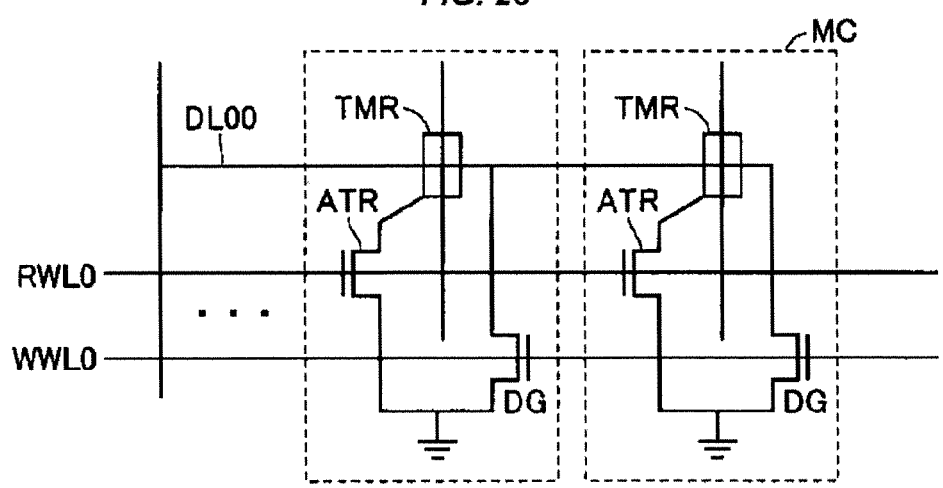
FIG. 20 is a view representing a structure of the memory cell MC of the block BK00 of a seventh embodiment.
Figure 22:
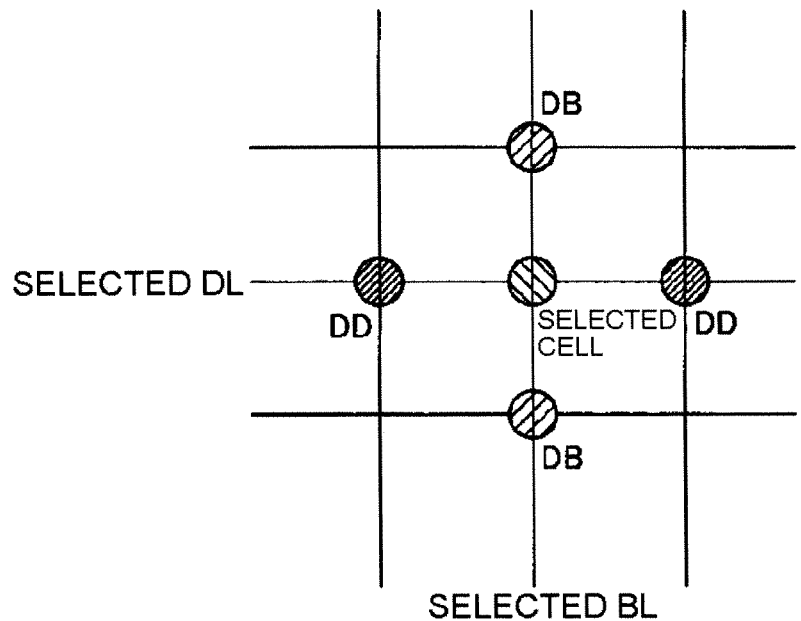
FIG. 22 is a diagram representing an arrangement relation among a memory cell (tunnel magnetoresistance device), a bit line BL, and a digit line DL.
Figure 23:
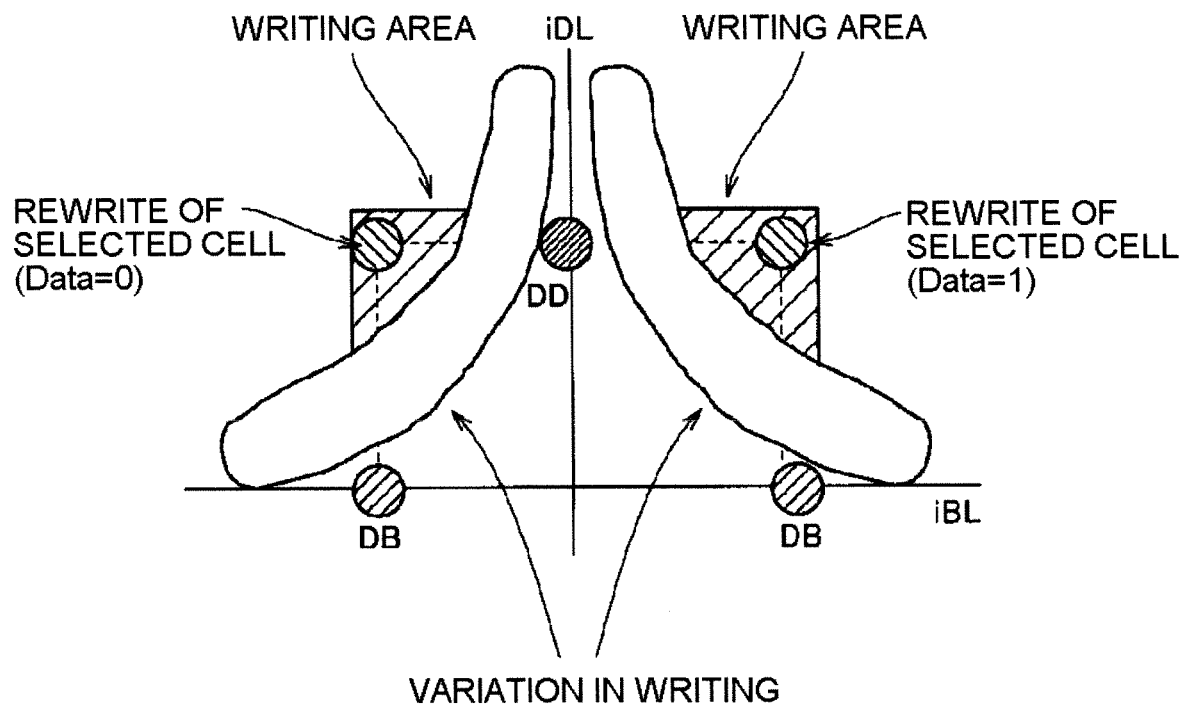
FIG. 23 is a diagram representing switching characteristics of a TRM element.
Figure 24:
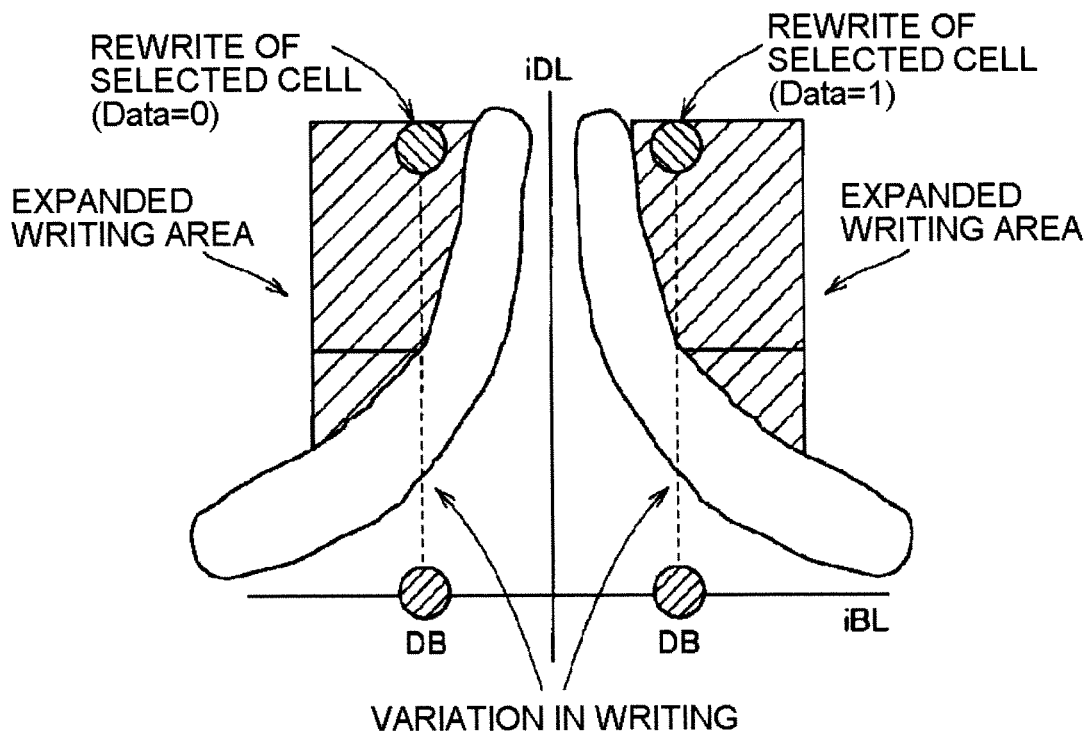
FIG. 24 is a diagram representing switching characteristics of the TRM element when segment writing is carried out.
Figure 25:
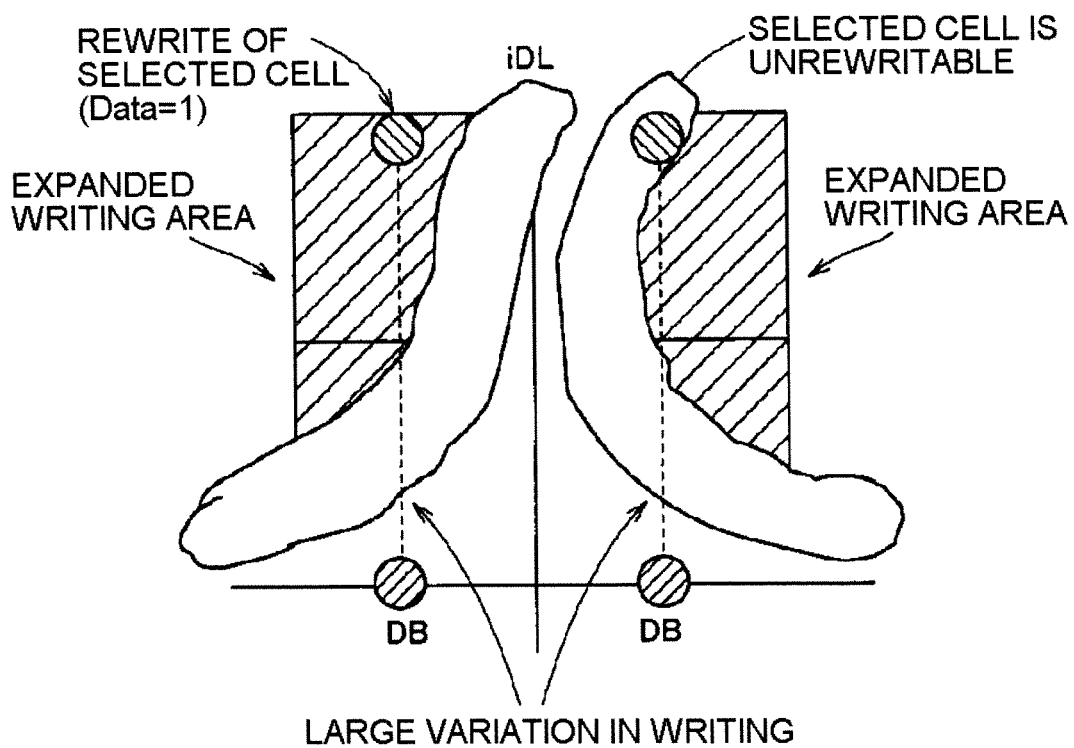
FIG. 25 is a diagram representing switching characteristics of the TRM element with distortion when segment writing is carried out.

FIG. 20 is a view representing a structure of the memory cell MC of the block BK00 of a seventh embodiment. The memory cells in other blocks have the same structure as this one.

In the seventh embodiment, each memory cell MC includes a DL selection gate DG for coupling the digit line DL00 to the source (ground).

FIG. 21A is a view of the structure of the block BK00 of FIG. 2 viewed from the direction perpendicular to the semiconductor substrate. FIG. 21B is a view for explaining the diffusion region of a transistor in FIG. 21A.

As shown in FIG. 21B, the DL selection gate DG and the diffusion regions DFL1, DFL2, DFL3, and DFL4 constituting the access transistor ATR are spaced apart from each other for each memory cell. Since such each diffusion region is continuously present at predetermined spacing in the MRAM and the pattern of the memory cell is made uniform, the pattern exposure in the manufacturing process is advantageously facilitated.

All the embodiments disclosed here should be considered to be illustrative only in every respect but not restrictive. The scope of the present invention is indicated not by the aforementioned descriptions but by the scope of the appended claims. The scope of the present invention is intended to include the meaning equivalent to the appended claims and all the modification within the scope of the present inventions.

What is claimed is:

1. A semiconductor device comprising a memory array, in which a memory cell for magnetically storing a data signal is arranged in a matrix, the memory array being divided into
   a plurality of segments for each predetermined number of columns, each segment being further divided into blocks for each row, the semiconductor device further comprising:
   a digit line provided for each block;
   a plurality of bit lines provided corresponding to each column;
   a plurality of digit line drivers each causing a magnetizing current to flow through the digit line of one selected block;
   a bit line driver which causes a write current to flow in a direction corresponding to a logic of a data signal to a bit line in a selected segment and writes the data signal to a memory cell of the selected block;
   and a decoder which, when an address of one segment has been input from the outside, selects one segment corresponding to the address and couples the selected segment to either one of the digit line drivers, and which, when addresses of two or more segments have been input from the outside, selects two or more segments corresponding to the addresses and couples the selected two or more segments to different digit line drivers.

2. The semiconductor device according to claim 1, wherein the decoder, when addresses of two or more non-adjacent segments have been input from an outside, selects two or more non-adjacent segments corresponding to the addresses and couples the selected segments to different digit line drivers.

3. The semiconductor device according to claim 1, wherein the memory cell includes:
   a tunnel magnetoresistive element; and
   an access gate which, in reading data, causes a current to flow from the tunnel magnetoresistive element to a source, and wherein
   the block includes a selection gate which couples a digit line in a block to the source.

4. The semiconductor device according to claim 1, wherein the memory cell includes:
   a tunnel magnetoresistive element;
   an access gate which, in reading data, causes a current to flow from the tunnel magnetoresistive element to a source; and
   a selection gate which couples a digit line in the memory cell to the source.

5. The semiconductor device according to claim 3 or 4, wherein a source of the selection gate and a source of the access gates are shared with each other.

6. A semiconductor device comprising a memory array, in which a memory cell for magnetically storing a data signal is arranged in a matrix, the memory array being divided into a plurality of segments for each predetermined number of columns, each segment being further divided into blocks for each row, the semiconductor device further comprising:
   a digit line provided for each block;
   a plurality of bit lines provided corresponding to each column;
   a digit line driver which causes a magnetizing current to flow through a digit line of a selected block; and a bit line driver which causes a write current to flow in a direction corresponding to a logic of a data signal to a bit line in a selected segment and writes the data signal to a memory cell of the selected block, wherein the digit line driver, when the magnetizing current falls, reduces the magnetizing current at a speed slower than that when the magnetizing current rises.

7. The semiconductor device according to claim 6, wherein the digit line driver includes:
- a constant current source outputting a specific amount of current;
- a transistor present in parallel to a path through which the magnetizing current flows from an output node of the constant current source, the transistor being provided in a path between the output node of the constant current source and a ground; and
- an RC circuit for slowly decreasing a potential of a gate of the transistor.

8. The semiconductor device according to claim 6, wherein the digit line driver includes:
- a constant current source outputting a specific amount of current;
- a specified number of transistors each present in parallel to a path through which the magnetizing current flows from an output node of the constant current source, the each transistor being provided in a path between the output node of the constant current source and a ground; and
- a timing signal generation circuit outputting a predetermined number of timing signals, the timing signals being activated at different timings, wherein
- a gate of each transistor receives a corresponding timing signal.

9. A semiconductor device comprising a memory array, in which a memory cell for magnetically storing a data signal is arranged in a matrix, the memory array being divided into a plurality of segments for each predetermined number of columns, each segment being further divided into blocks for each row, the semiconductor device further comprising:
- a digit line provided for each block;
- a plurality of bit lines provided corresponding to each column;
- a digit line driver which causes a magnetizing current to flow through a digit line of a selected block; and
- a bit line driver which causes a write current to flow in a direction corresponding to a logic of a data signal to a bit line in a selected segment and writes the data signal to a memory cell of the selected block, wherein the bit line driver causes the write current to rise, subsequently, the digit line driver causes the magnetizing current to rise, subsequently, the digit line driver causes the magnetizing current to fall, and subsequently, the bit line driver causes the write current to fall.

10. A semiconductor device comprising a memory array, in which a memory cell for magnetically storing a data signal is arranged in a matrix, the memory array being divided into a plurality of segments for each predetermined number of columns, each segment being further divided into blocks for each row, the semiconductor device further comprising:
- a digit line provided for each block;
- a plurality of bit lines provided corresponding to each column;
- a digit line driver which causes a magnetizing current to flow through a digit line of a selected block; and
- a bit line driver which causes a write current to flow in a direction corresponding to a logic of a data signal to a bit line in a selected segment and writes the data signal to a memory cell of the selected block, wherein the bit line is formed with a cladding wiring structure, and wherein the bit line drivers causes the write current to rise or fall at a speed slower than that when the magnetizing current rises.

* * * * *